US007388521B2

(12) United States Patent
Lu et al.

(10) Patent No.: US 7,388,521 B2
(45) Date of Patent: Jun. 17, 2008

(54) REQUEST BITS ESTIMATION FOR A WYNER-ZIV CODEC (75) Inventors: Yan Lu, Beijing (CN); Mei Guo, Harbin (CN); Feng Wu, Beijing (CN); Shipeng Li, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 11/537,947

(22) Filed: Oct. 2, 2006

(65) Prior Publication Data
US 2008/0079612 A1 Apr. 3, 2008

(51) Int. Cl.
H03M 7/34 (2006.01)
(52) U.S. Cl. .......................................... 341/51; 341/107
(58) Field of Classification Search .................. 341/50, 341/51, 56, 67, 107
See application file for complete search history.

(56) References Cited

U.S. PATENT DOCUMENTS

| | | | |
|---|---|---|---|
| 5,144,423 A | 9/1992 | Knauer et al. | |
| 5,719,632 A | 2/1998 | Hoang et al. | |
| 5,818,536 A | 10/1998 | Morris et al. | |
| 5,862,450 A | 1/1999 | Mandal et al. | |
| 6,018,303 A | 1/2000 | Sadeh | |
| 6,122,320 A | 9/2000 | Bellifemine et al. | |
| 6,275,532 B1 | 8/2001 | Hibi et al. | |
| 6,289,049 B1 | 9/2001 | Kim et al. | |
| 6,498,810 B1 | 12/2002 | Kim et al. | |
| 6,526,097 B1 | 2/2003 | Sethuraman et al. | |
| 6,542,549 B1 | 4/2003 | Tan et al. | |
| 6,628,712 B1 | 9/2003 | Le Maguet | |
| 6,717,990 B1 | 4/2004 | Abousleman | |
| 6,735,249 B1 | 5/2004 | Karczewicz et al. | |
| 6,920,175 B2 | 7/2005 | Karczewicz et al. | |
| 6,947,486 B2 | 9/2005 | Akhan et al. | |
| 7,003,035 B2 | 2/2006 | Tourapis et al. | |
| 7,031,389 B2 | 4/2006 | Guevorkian et al. | |

(Continued)

FOREIGN PATENT DOCUMENTS

EP 0971542 1/2000

(Continued)

OTHER PUBLICATIONS

Aaron et al., "Compression with Side Information Using Turbo Codes", Proc. of Data Compression Conf (DCC 02), Apr. 2002, Utah, 10 pgs.

(Continued)

Primary Examiner—Brian Young
(74) Attorney, Agent, or Firm—Lee & Hayes, PLLC (57) ABSTRACT Request bits estimation for a Wyner-Ziv codec is described. In one aspect, and prior to communicating Wyner-Ziv parity bits to a Wyner-Ziv decoder, an estimated total number of parity bits to send to the Wyner-Ziv decoder are determined. This estimated number of parity bits allows the Wyner-Ziv decoder to reconstruct a frame of different coded content using the Wyner-Ziv parity bits such that the reconstructed frame will meet particular quality criteria. This estimated number of parity bits is determined independent of a request-bits feedback loop between the Wyner-Ziv coder and the Wyner-Ziv decoder. The estimated number of parity bits is communicated to the Wyner-Ziv decoder for reconstruction and presentation of the frame to a user.

20 Claims, 6 Drawing Sheets

U.S. PATENT DOCUMENTS

| | | | |
|---|---|---|---|
| 7,233,269 | B1 | 6/2007 | Chen et al. |
| 7,256,716 | B2 | 8/2007 | Liu et al. |
| 2003/0151753 | A1 | 8/2003 | Li et al. |
| 2003/0156644 | A1 | 8/2003 | Song et al. |
| 2004/0039571 | A1 | 2/2004 | Bruekers et al. |
| 2004/0114684 | A1 | 6/2004 | Karczewicz et al. |
| 2004/0172478 | A1 | 9/2004 | Jacobs et al. |
| 2005/0013371 | A1 | 1/2005 | Yim et al. |
| 2005/0024487 | A1 | 2/2005 | Chen |
| 2005/0036550 | A1 | 2/2005 | Koba et al. |
| 2005/0047508 | A1 | 3/2005 | Ha et al. |
| 2005/0084014 | A1 | 4/2005 | Wang et al. |
| 2005/0105815 | A1 | 5/2005 | Zhang et al. |
| 2005/0201468 | A1 | 9/2005 | Tsai et al. |
| 2005/0232360 | A1 | 10/2005 | Byun |
| 2005/0268200 | A1* | 12/2005 | Garudadri et al. .......... 714/746 |
| 2006/0008006 | A1 | 1/2006 | Cha et al. |
| 2006/0062299 | A1 | 3/2006 | Park et al. |
| 2006/0072662 | A1 | 4/2006 | Tourapis et al. |
| 2006/0197686 | A1 | 9/2006 | Liu et al. |
| 2006/0197690 | A1* | 9/2006 | Liu et al. ...................... 341/87 |
| 2006/0200733 | A1 | 9/2006 | Stankovic et al. |
| 2007/0013561 | A1 | 1/2007 | Xu et al. |
| 2007/0014356 | A1 | 1/2007 | Han et al. |
| 2007/0041652 | A1 | 2/2007 | Budge et al. |
| 2007/0165717 | A1 | 7/2007 | Ye |
| 2007/0217541 | A1 | 9/2007 | Liu et al. |

FOREIGN PATENT DOCUMENTS

| | | |
|---|---|---|
| WO | WO2005043882 A2 | 5/2005 |

OTHER PUBLICATIONS

Aaron, et al., "Towards Practical Wyner-Ziv Coding of Video", vol. 3, IEEE, Sep. 14-17, 2003, pp. 869-872.

Aaron, et al., "Transform-domain Wyner-Ziv Codec for Video", found at <<http://citeseer.ist.psu.edu/cache/papers/cs/31531/http:zSzzSzwww.stanford.eduzSz~bgirodzSzpdfszSzAaronVCIP04.pdf/transform-domain-wyner-ziv.pdf>>, VCIP, Jan. 2004, 9 pgs.

Aaron et al., "Wyner-Ziv Coding of Motion Video", Proc. Asilomar Conf on Signals and Systems, California, Nov. 2002, 5 pgs.

Aaron, et al., "Wyner-Ziv Video Coding with Hash-Based Motion Compensation at the Receiver", vol. 5, Oct. 24-27, 2004, pp. 3097-3100.

Adikari, et al., "Side Information Improvement in DVC with Two Side Information Streams and 3D Motion Refinement," retrieved at <<http://ieeexplore.ieee.org/iel5/4232658/4232659/04232674.pdf?isnumber=4232659&prod=CNF&arnumber=4232674&arSt=& ared=35&arAuthor=Adikari%2C+A.+B.+B.%3B+Fernando%2C+W.+A.+C.%3B+Weerakkody%2C+W.+A.+R.+J.&htry=1>>, IEEE, 2007, pp. 32-35.

Artigas, et al., "A Model-Based Enhanced Approach To Distributed Video Coding", Image Analysis for Multimedia Interactive Services, WIAMIS, Apr. 2005, 4 pgs.

Barron, et al., "The Duality Between Information Embedding and Source Coding with Side Information and Some Applications", available at least as early as Jun. 4, 2007, retrieved at <<http://allegro.mit.edu/pubs/posted/journal/2003-barron-chen-wornell-it.pdf>>, IEEE Transactions on Information Theory, vol. 49, No. 5, May 2003, pp. 1159-1180.

Berrou, et al., "Near Shannon Limit Error-Correcting Coding and Decoding:Turbo-Codes (1)", Proc. IEEE International Conference on Communications, Geneva, Switzerland, May 1993, pp. 1064-1070.

Chen et al., "Fast Integer Pel and Fractional Pel Motion Estimation for JVT", JVT-FO17, 6th Mtg, Japan, Dec. 2002, 14 pgs.

Chen et al, "Rate Control for Streaming Video over Wireless", Proc. INFOCOM 2004, Hong Kong, China, Mar. 2004, 6 pgs.

Dalai, et al., "Improving Turbo Codec Integration in Pixel-Domain Distributed Video Coding," found at <<http://www.discoverdvc.org/publications/IST/DLP_ICASSP06.pdf>>, IEEE Intl Conf on Acoustics, Speech and Signal Processing, vol. 2, 2006, 4 pgs.

Divsalar, et al., "Multiple Trellis Coded Modulation (MTCM)," IEEE Transactions on Communications, vol. 36, No. 4, Apr. 1988, pp. 410-419.

Fowler, et al., "Wavelet-Based Distributed Source Coding Of Video", Proc. of European Signal Processing Conf, Turkey, 2005, 4 pgs.

Girod, et al., "Distributed Video Coding", IEEE, Special Issue on Advances in Video Coding and Delivery, vol. 93, Issue 1, Jan. 2005, pp. 1-12.

Guo et al., "Dependency Modeling in Multiple Bit-Rate Video Streaming Using Wyner-Ziv Coding", ICIP, 2006, 5 pgs.

Guo et al, "Free Viewpoint Switching in Multi-View Video Streaming Using Wyner-Ziv Video Coding", SPIE Visual Communications and Image Processing, Jan. 2006, 8 pgs.

He et al., "Power-Rate-Distortion Analysis for Wireless Video Communication under Energy Constraints", IEEE Trans. on Circuits and Systems for Video Technology, vol. 15, May 2005, 13 pgs.

Karczewicz et al., "The SP- and SI-Frames Design for H.264/AVC", IEEE Trans. on Circuits and Systems for Video Technology, vol. 13, No. 7, Jul. 2003, 8 pgs.

Liu, et al., "Wyner-Ziv Video Coding Using LDPC Codes", IEEE, Jun. 2006, pp. 258-261.

Martucci et al., "Zerotree Entropy Coding of Wavelet Coefficients for Very Low Bit Rate Video", ICIP 1996, Swizerland, Sep. 1996, 4 pgs.

Pradhan et al., "Distributed Source Coding Using Syndromes (DISCUS): Design and Construction", IEEE Trans. on Information Theory, vol. 49, No. 3, Mar. 2003, 18 pgs.

Pu et al., "Joint Power-Distortion Optimization on Devices with MPEG-4 AVC/H.264 Codec", Proc. ICC 2006, Turkey, Jun. 2006, 6 pgs.

Puri et al., "Prism: A New Robust Video Coding Architecture Based on Distributed Compression Principles", Proc. 40th Allerton Conf on Communication, Control, and Computing, Illinois, Oct. 2002, 10 pgs.

Puri et al., "Prism: A Reversed Multimedia Coding Paradigm", IEEE Int. Conf. Image Processing, Spain, 2003, 4 pgs.

Rowitch et al., "On the Performance of Hybrid FEC/ARQ Systems Using Rate Compatible Punctured Turbo (RCPT) Codes", IEEE Trans. on Communications, vol. 48, No. 6, Jun. 2000, 12 pgs.

Slepian, et al., "Noiseless Coding of Correlated Information Sources", IEEE Transactions on Information Theory, vol. IT-19, No., 4, Jul. 1973, pp. 471-480.

"Source Coding", retrieved on Apr. 25, 2006 at <<http://www.irisa.fr/temics/research/coding.php>>, pp. 1-6.

Sun, et al., "Efficient And Flexible Drift-Free Video Bitstream Switching At Predictive Frames", vol. 1, IEEE, 2002, 4 pgs.

Sun, et al., "Seamless Switching of Scalable Video Bitstreams for Efficient Streaming", vol. 6, No. 2, IEEE, Transactions On Multimedia, Apr. 2004, pp. 291-303.

Sun et al., "The Improved SP Frame Coding Technique for The JVT Standard", Proc. IEEE ICIP 2003, vol. 3, Spain, Sep. 2003, 4 pgs.

Vleeschouwer, et al., "Motion Estimation For Low Power Video Devices", IEEE, Oct. 7-10, 2001, vol. 2, pp. 953-956.

Wang, et al., "Wzs: Wyner-Ziv Scalable Predictive Video Coding", Proc. of Picture Coding Symposium, Dec. 2004, 6 pgs.

Westerlaken, et al., "Turbo-Code Based Wyner-Ziv Video Compression", found at <<http://ict.ewi.tudelft.nl/pub/ronald/RPWesterlaken Wic2005.pdf>>, 26th Symposium on Information Theory in the Benelux, May 2005, 8 pgs.

Wiegand et al., "Overview of the H.264/AVC Video Coding Standard", IEEE Trans. on Circuits and Systems for Video Technology, vol. 13, No. 7, Jul. 2003, 19 pgs.

Wu, et al., "Multiple Description Image Coding with Distributed Source Coding and Side Information", Mitsubishi Electric Research Laboratories, Inc., Dec. 2004, 10 pgs.

Wyner, et al., "The Rate-Distortion Function for Source Coding with Side Information at the Decoder", IEEE Transactions on Information Theory, vol. IT-22, No. 1, Jan. 1976, pp. 1-10.

Yang et al., "A Framework for Fine-Granular Computational-Compleity Scalable Motion Estimation", Proc. IEEE, ISCAS 2005, vol. 6, May 2005, 4 pgs.

Yang, et al., "Adaptive Key Frame Selection Wyner—Ziv Video Coding", 2005 IEEE 7th Workshop on Multimedia Processing, Oct. 2005, 4 pgs.

Yang, et al., "Wyner-Ziv Coding Based on TCQ and LDPC Codes", vol. 1, IEEE, Nov. 9-12, 2003, pp. 825-829.

Zamir, et al., "Nested Linear/Lattice Codes for Structured Multiterminal Binning", IEEE Transactions on Information Theory, vol. 48, No. 6, Jun. 2002, pp. 1250-1276.

Zhao, et al., "Complexity Management for Video Encoders", ACM, 2002, 3 pgs.

Zhao, et al., "Computational Complexity Management of Motion Estimation in Video Encoders", Proceedings of the Data Compression Conference, IEEE, 2002, 1 pgs.

* cited by examiner

REQUEST BITS ESTIMATION FOR A WYNER-ZIV CODEC

BACKGROUND

Figure 1:
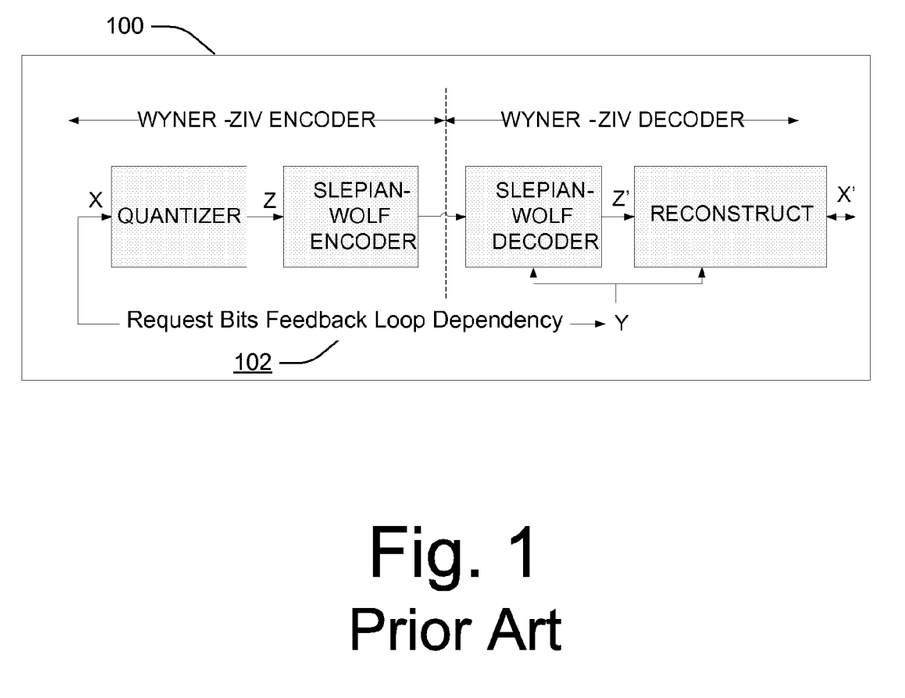
FIG. 1 shows a conventional Wyner-Ziv codec that implements a conventional request bits feedback loop between the decoder and the encoder.

Wyner-Ziv's theorem on source coding with side information available only at the decoder provides for an asymmetric video codec, where individual frames are coded separately in view of the side information, but decoded conditionally. Without such decoder provided side information, a Wyner-Ziv coder is unable to estimate the number of Wyner-Ziv bits to send to the decoder. This is because the number of Wyner-Ziv bits depends on a correlation between an input frame and a corresponding side information frame, which has not been able to be estimated at the coder. As a result, and without additional information being provided to the coder, rate allocation at the coder is typically not accurate. In view of this, conventional Wyner-Ziv source coding schemes typically employ a feedback loop between the coder and decoder for the decoder to request additional refinement bits from an coder to enhance decoded video quality. FIG. 1 shows a conventional Wyner-Ziv codec that implements a conventional request bits feedback loop 102 between the decoder and the encoder. Through this feedback loop 102, the decoder sends the coder the needed number of bits. However, such a feedback loop often results in unacceptable latency of video playback during real-time video streaming operations.

SUMMARY

Request bits estimation for a Wyner-Ziv codec is described. In one aspect, and prior to communicating Wyner-Ziv parity bits to a Wyner-Ziv decoder, an estimated total number of parity bits to send to the Wyner-Ziv decoder are determined. This estimated number of parity hits allows the Wyner-Ziv decoder to reconstruct a frame of different coded content using the Wyner-Ziv parity bits such that the reconstructed frame will meet particular quality criteria. This estimated number of parity bits is determined independent of a request-bits feedback loop between the Wyner-Ziv coder and Wyner-Ziv decoder. The estimated number of parity bits is communicated to the Wyner-Ziv decoder for reconstruction and presentation of the frame to a user.

This Summary is provided to introduce a selection of concepts in a simplified form that are further described below in the detailed description. This Summary is not intended to identify key features or essential features of the claimed subject matter, nor is it intended to be used as an aid in determining the scope of the claimed subject matter.

BRIEF DESCRIPTION OF THE DRAWINGS

In the Figures, the left-most digit of a component reference number identifies the particular Figure in which the component first appears.

DETAILED DESCRIPTION

Overview

Use of Wyner-Ziv coding using turbo codes is generally considered to be impractical due to the process of the decoder requesting additional bits from the coder via a feedback loop to improve visual quality of the decoded bitstream. The systems and methods for request bits estimation for a Wyner-Ziv codec overcome this limitation directly at where the bits are being encoded, that is, at the Wyner-Ziv coder portion of a Wyner-Ziv codec. This is accomplished in several implementations that are directed to switching between different non-Wyner-Ziv bitstreams X and X' using a Wyner-Ziv switching frame. For each X, the Wyner-Ziv coder generates a Wyner-Ziv switching/correlation frame. For each pair of X and corresponding side information Y, the Wyner-Ziv coder uses a request bits estimator to analyze statistical dependencies between distributions of differential signals. Based on the analysis, the request bits estimator determines the total number of Wyner-Ziv parity bits that the decoder will need to reconstruct a frame of regularly encoded content X' from Y, such that X' will meet a target arbitrary decoded frame quality. Such a quality determination can be made using any of numerous known decoded frame quality criteria. At a switching point n, a corresponding Y, which is a previously reconstructed frame derived from regular coded bitstream, is transmitted to the decoder. Subsequent to transmitting Y, the estimated number of Wyner-Ziv parity bits are transmitted to the decoder for decoding and reconstruction of respective X' from Y and the additional parity bits. This is accomplished independent of the conventional request bit feedback loop required by existing Wyner-Ziv codecs.

These and other aspects of the systems for request bits estimation for a Wyner-Ziv codec are now described in greater detail.

An Exemplary System

Although not required, systems and methods for request bits estimation for a Wyner-Ziv codec are described in the general context of computer-executable instructions executed by a computing device such as a personal computer. Program modules generally include routines, programs, objects, components, data structures, etc., that perform particular tasks or implement particular abstract data types. While the systems and methods are described in the foregoing context, acts and operations described hereinafter may also be implemented in hardware.

Figure 2:
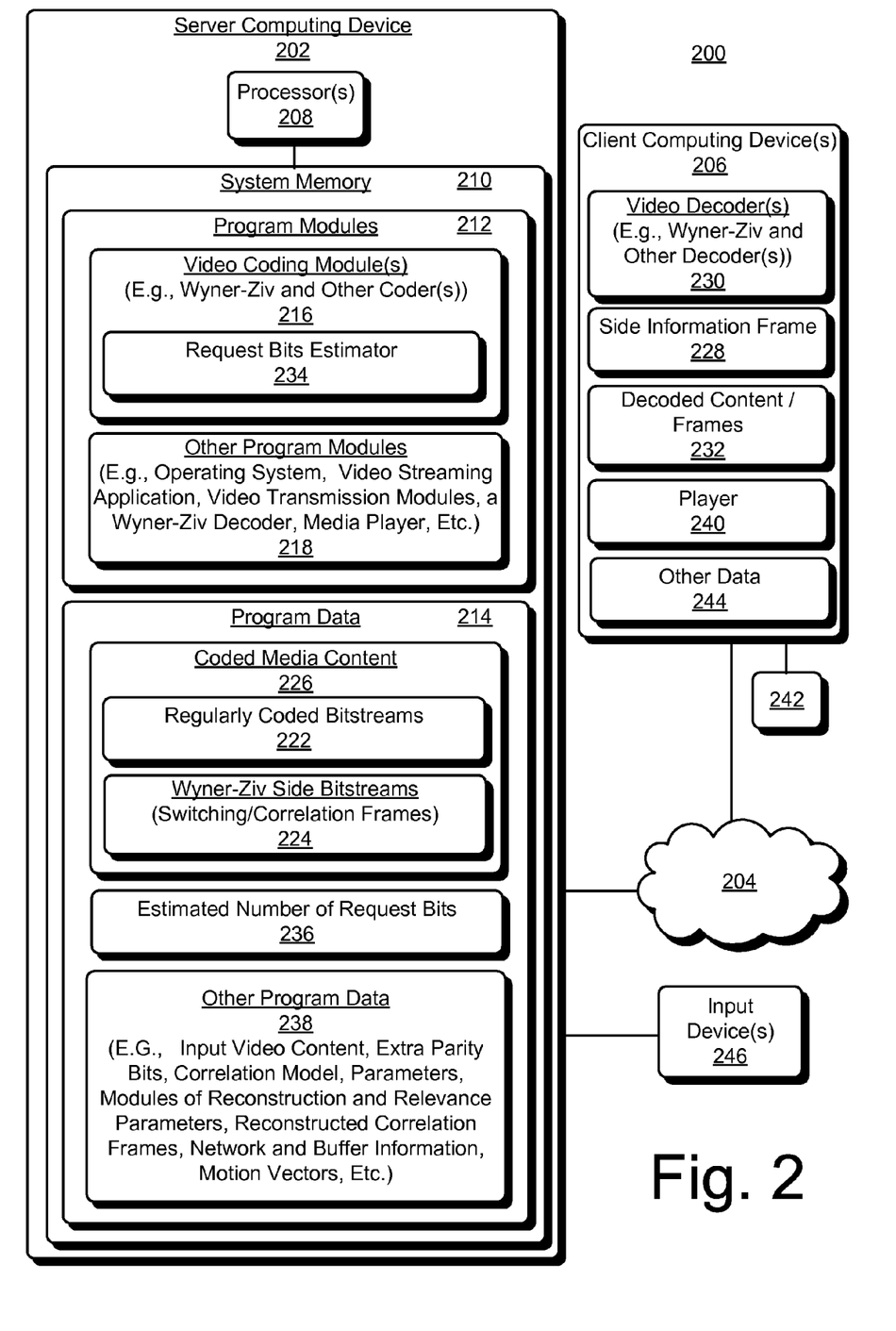
FIG. 2 shows an exemplary system for request bits estimation for a Wyner-Ziv codec, according to one embodiment.

FIG. 2 shows an exemplary system 200 for request bits estimation for a Wyner-Ziv codec, according to one embodiment. System 200 includes a server-computing device ("server") 202 coupled across a network 204 to one or more client computing devices ("client") 206. Server 202 and/or client 206 may be for example a general purpose computing device, a server, a laptop, a mobile computing device, and/or so on. Network 204 may include any combination of a local area network (LAN) and a general wide area network (WAN) communication environments, such as those which are commonplace in offices, enterprise-wide computer networks, intranets, and the Internet.

In this implementation, server 202 and client 206 implement a turbo code based Wyner-Ziv coding scheme to facilitate bitstream switching at any desired frame of regularly coded video data (i.e., non-Wyner-Ziv coded video data) without affecting coding efficiency of the transmitted bitstreams. One reason for this is because server 202 and client 206 switching operations are independent of a conventional request bits feedback loop between the Wyner-Ziv decoder (please see client 206) and the Wyner-Ziv coder 216. Additionally, for any one input frame X, the server's turbo code based Wyner-Ziv coding operations provide for use of a same embedded Wyner-Ziv bitstream of switching frames to switching from any regularly coded (non-Wyner-Ziv bitstream) to a new regularly coded bitstream.

To these ends, server 202 and client 206 include one or more respective processors coupled to a system memory comprising computer-program modules and program data. Each respective processor is configured to fetch and execute computer-program instructions from respective ones of the computer-program modules and obtain data from program data. For example, server 202 includes processor 208 coupled to system memory 210. Processor 208 may be a microprocessor, microcomputer, microcontroller, digital signal processor, etc. System memory 210 includes, for example, volatile random access memory (e.g., RAM) and non-volatile read-only memory (e.g., ROM, flash memory, etc.). System memory 210 comprises program modules 212 and program data 214. Program modules 212 include, for example, video coding modules ("coders") 216 and "other program modules" 218 such as an Operating System (OS) to provide a runtime environment, a video streaming application that leverages operations of coder 216, bitstream transmission modules, a conventional frame decoder and a Wyner-Ziv frame decoder, a media player, device drivers, and/or so on.

In one implementation, coders 216 include, for example, a conventional coder (e.g., an H.264 coder, etc.) and a Wyner-Ziv coder. For a video streaming application to switch between different non-Wyner-Ziv coded bitstreams X and X' using a Wyner-Ziv switching/correlation frame, for input signal X (i.e., input video data), the conventional coder produces multiple streams of regular coded media content 222 (e.g., as per the implementation of the conventional coder). Each regularly coded stream of coded media content is generated from a same piece of input video data and coded according to a different respective bit transmit rate.

The Wyner-Ziv coding portion of coder 216 implements any known Wyner-Ziv coding scheme to produce multiple Wyner-Ziv side bitstreams 224 of coded media content (i.e., Wyner-Ziv bits) corresponding to the multiple regularly coded streams. (These multiple side streams are also shown as respective portions of coded media content 226, which collectively encapsulates regular coded media content 222 and Wyner-Ziv side bitstreams 224). Each side bitstream 224 represents the switching/correlation frames, one switching frame per frame of the input signal X. That is, for at least a subset of frame(s) of X, the Wyner-Ziv coder produces Wyner-Ziv bits for the coding of X at a bitstream switching point at time n (the time corresponds to a time in a video presentation timeline). For a frame of X, the corresponding Y represents the same content of the frame, but with a different reconstruction, or quality based on different coding parameters. As a result, X and Y are statistically dependent correlation frames. There is no motion between the correlation frames. This can be simplified as X=Y–D, where D represents the residue or mutual dependency between the X and Y.

In contrast to conventional Wyner-Ziv coding techniques, Wyner-Ziv coder also embeds modules of reconstruction and relevance parameters into respective Wyner-Ziv Side bit-streams 224. For purposes of exemplary illustration, such modules of reconstruction and relevance parameters are shown as a respected portion of "other program data" 238. As described below in the section titled "Request Bits Estimation", Wyner-Ziv coder 216 extracts such embedded information from the Wyner-Ziv side bit-streams 224 corresponding to both X and side information frame Y at a switch point for communicating to request bits estimator module 234. Request bits and estimator module 234 uses this communicated information to determine the number of extra bits 236 from Wyner-Ziv side bitstreams 224 for Wyner-Ziv coder 216 to send to decoder 230 independent of a conventional request bits feedback loop.

More particularly, a conventional coder 216, or a video streaming application leveraging operations of the conventional coder 216, communicates frames of the regularly coded bitstreams 222 to client 206. (Exemplary video transmission module(s) are shown as respective portions of "other program modules" 218). Responsive to receiving frames from a regularly coded bitstream 222, decoder 230 utilizes a conventional decoder 230 to decode the coded frames to generate respective portions of decoded content / frames 232. During media content streaming operations, a conventional coder 216 or a video streaming application leveraging the conventional coder 216 determines that a first regular coded bitstream 222 being streamed to client 206 should be switched-out with a different regular coded bitstream 222. (Such a determination can be made in view of multiple different criteria such as in view of network bandwidth data throughput and corresponding coded data bit rate considerations, responsive to user input, etc.).

Responsive to a determination to switch between regular coded bitstreams 222 at a switching point, Wyner-Ziv coder 216 uses request bits estimator 234 to derive embedded modules of reconstruction and relevance parameter(s) from the Wyner-Ziv side bitstreams 224 corresponding to both X and side information Y at the switching point. Request bits estimator module 234 uses this extracted information to estimate the number of parity bits 236 to send to Wyner-Ziv decoder 230 to allow decoding of side information Y to arrive at an X' with a target level of quality. This is accomplished independent of a conventional request bet feedback loop. Wyner-Ziv coder 216 allocates this extra number of parity bits from Wyner-Ziv side bitstreams 224. At a switching point n, a video streaming application (or Wyner-Ziv coder 216) transmits the allocated Wyner-Ziv parity bits to the Wyner-Ziv decoder 230 for decoding and presentation of X' to a user. Such "extra parity bits" are shown as a respective portion of "other program data" 238.

Responsive to receiving the Wyner-Ziv parity bits 224, the Wyner-Ziv decoder 230 decodes and reconstructs a respective X' (232) according to one or more exemplary bitstream switching schemes. At the client 206, decoded content/frames 232 are presented to a user by media player 240 via display device 242. In one implementation, a first bitstream switching scheme such as the one described below in the section titled "A First Exemplary Bit Switching Scheme" is used by the Wyner-Ziv codec to switch from a first regular coded bitstream 222 to a second regular coded bitstream 222. In another implementation, a second bitstream switching schemes such as the one described below in the section titled "A Second Exemplary Bit Switching Scheme" is used by the Wyner-Ziv codec to switch from a first regular coded bitstream 222 to a second regular coded bitstream 222.

An Exemplary Wyner-Ziv Codec

Figure 3:
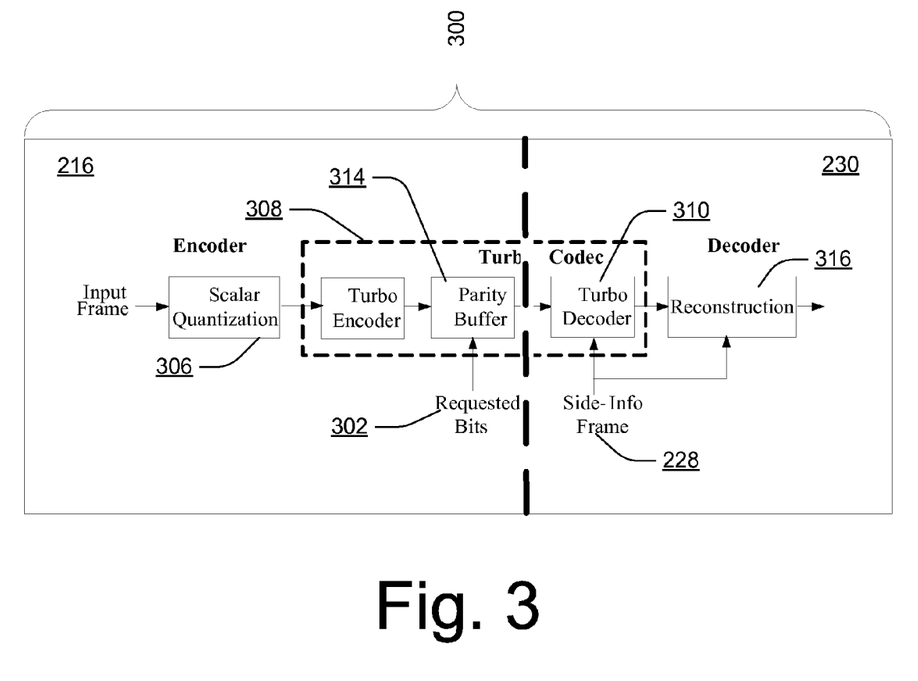
FIG. 3 shows an exemplary Wyner-Ziv codec for request bits estimation, according to one embodiment.

FIG. 3 shows an exemplary Wyner-Ziv codec 300 for request bits estimation, according to one embodiment. For purposes of exemplary description, components of Wyner-Ziv codec 300 are described in reference to components of FIG. 2. In the description, the left-most numeral of a component reference number indicates the figure where the component was first introduced. For example, codec 300 includes Wyner-Ziv coder 216 and Wyner-Ziv decoder 230. The leftmost numeral of both Wyner-Ziv coder 216 and Wyner-Ziv decoder 230 reference numbers is a "2". Thus, Wyner-Ziv coder 216 and Wyner-Ziv decoder 230 were each first introduced with respect to FIG. 2.

Referring to FIG. 3, Wyner-Ziv encoder 216 includes scalar quantization 306 and turbo encoder 308. Encoder 216 transmits only Wyner-Ziv bits (parity bits in terms of the switching point) to the turbo decoder 310 until the Wyner-Ziv frame can be decoded correctly with side information frame 228. Please note that in this example, codec 300 does not implement a request bits feedback loop (e.g., please see the request bits feedback loop 102 of FIG. 1) between the Wyner-Ziv decoder 230 and the Wyner-Ziv coder 216. Rather, Wyner-Ziv coder 216 provides an estimated number of request bits 302 to the parity buffer 314 portion of the Wyner-Ziv turbo coder 310 independent of any request bits feedback loop between Wyner-Ziv decoder 230 and Wyner-Ziv encoder 216. As described above, this is accomplished through use of request bits estimator 234 (shown in FIG. 2) to analyze statistical dependencies of X and Y at a bitstream switching point, and there from, provide decoder 228 with enough bits to generate (reconstruction 316) a quality decoded frame 232 from the decoded Wyner-Ziv bits and a decoder generated side-information frame 228. Exemplary operations of Wyner-Ziv coder 216 and request bits estimator 234 to estimate request bits are described in greater detail below in the section titled "Request Bits Estimation".

Request Bits Estimation

For each input frame X, Wyner-Ziv coder 216 uses request bits estimator 234 to estimate the total number of Wyner-Ziv bits to send the decoder 230. (This estimate is shown as the estimated number of request bits 236). Request bits estimator 234 analyzes statistical dependencies between distributions of differential signals between a corresponding original frame of video data X (input video data) that is a reconstructed frame of a regular coded bitstream 222 and side information Y that is a reconstructed frame based on another regular coded bitstream 222. Based on the analysis, the request bits estimator 234 determines the number of total actual number of Wyner-Ziv parity bits that the decoder 230 will need to reconstruct a frame of regularly encoded content X' from Y, such that X' will meet a target arbitrary quality criteria. This total number of parity bits value is shown in FIG. 1 as "estimated number of requests bits 236". Responsive to this determination, the Wyner-Ziv coder 216 generates total number of parity bits independent of request bits feedback loop between the Wyner-Ziv coder and the Wyner-Ziv decoder to obtain a target quality for a finally decoded frame 232. (Side information Y 228 is only used at decoder 232 to decode and reconstruct X').

To analyze statistical dependencies between distributions of differential signals between an original frame X of input video content and a corresponding reconstructed Y, request bits estimator 234 first derives several parameters from X and the reconstructed Y. The derived parameters are modules of reconstructions which are generated from regular coded streams 222, and relevance parameters, both of which are produced by Wyner-Ziv coder 216 while Wyner-Ziv encoding. The values of reconstructed frames of coded media content 226 and original input video content can be viewed as vectors. The parameters include the modulars of these vectors and the relevancy parameter between the vectors of reconstructed frame and original video data. These parameters are stored in the corresponding Wyner-Ziv Side Bitstreams 224. When the bitstream switching occurs, Wyner-Ziv encoder 216 derives the parameters of relative bitstreams and calculates the Laplacian model parameter var. Based on the correlation model, the actually needed number of bits 236 is estimated by request bits estimation module 234 using var. Wyner-Ziv coder 216 then transmits the punctured parity bits according to the estimation to Wyner-Ziv decoder 230.

The number of request bits 236 depends on both a correlation model (including the model parameters) between an input frame X and a corresponding side information frame Y and the efficiency of Wyner-Ziv coder 216. It is assumed that the correlation between the X and Y complies with Laplacian model. In view of this, and in one implementation, request bits estimator 234 estimates the Laplacian model parameter. In another implementation, when the Laplacian model parameter is available, request bits estimator 234 derives the theory bound of the number of request bits 236. Also, based on statistics and analysis, a conclusion is drawn that the actual number of request bits 236 is closely related to the theory bound of the number of bits, depending on the particular operations employed by encoder 216. Therefore, for a particular Wyner-Ziv coder 216, the relationship between the actual number of request bits 236 and the one in theory is trained in advance. With respect to training, for example, for a series of frame sequences, both the actual number of request bits 236 and number of request bits 236 in theory are obtained. Then the relationship between the two and the Laplacian model parameter var is modeled. In one implementation, this model (i.e., the correlation model) is verified with a series of test sequences.

To merge the two above described steps, assuming that the Laplacian model parameters are available in terms of a Wyner-Ziv frame, the actual number of request bits 236 is directly derived as follows. In particular, and in one implementation for a general Wyner-Ziv codec 216, the relationship between the actual number of requested bits 236 (i.e., num_bits_required) and the Laplacian model parameter var is represented as follows.

$$\text{num\_bits\_required} = a \cdot var^b, \quad (1)$$

where a and b are constants decided by the employed Wyner-Ziv codec (please see codec 300 of FIG. 3). For example, in one implementation, the Wyner-Ziv codec has 16-level quantization, a=8120.977, and b=s+t×var, where s=0.3883 and t=0.00035418. These values relate to the efficiency of Wyner-Ziv coder 216, and they are independent of video content. Therefore, as for one Wyner-Ziv coder 216, such values are derived from training with a series of video sequences.

Techniques used by request bits module 234 to estimate Laplacian model parameter var in terms of a Wyner-Ziv switching frame are now described. (The var to be estimated is the variance of the distribution of residue between the X and Y. In this example, both X and Y are reconstructions of coded media data 222.) Laplacian model parameter var also denotes the variance of the residues between the input frame X and the side information frame Y. Let N denote the number of pixels in the frame X. Let $rec_{h\_i}$ and $rec_{l\_i}$ denote the reconstructed (i.e., "rec") values of the $i^{th}$ pixel in a high bit rate bitstream 222 and at the low bit rate bitstream 222, respectively. Therefore, $$var = \frac{1}{N}\sum_{i=1}^{N}(rec_{h\_i} - rec_{l\_i})^2 \quad (2)$$

$$= \frac{1}{N}\sum_{i=1}^{N}rec_{h\_i}^2 + \frac{1}{N}\sum_{i=1}^{N}rec_{l\_i}^2 - \frac{2}{N}\sum_{i=1}^{N}rec_{h\_i} \cdot rec_{l\_i}.$$

Further extending the third item in (2), as follows:

$$\sum_{i=1}^{N} rec_{h\_i} \cdot rec_{l\_i} = REC_h^T REC_l = \rho \cdot \|REC_h\| \cdot \|REC_l\|, \quad (3)$$

where $\rho$ reflects the degree of relevance between two vectors, and $\|\ldots\|$ expresses the module of the vector ("REC" denotes the vector, and "rec" denotes the pixels or the elements of the corresponding vector). Further, based on the statistics, we have:

$$\rho \approx \rho_l = \frac{ORIG^T REC_l}{\|ORIG\| \cdot \|REC_l\|}, \quad (4)$$

where ORIG denotes the vector composed of the original pixels in this frame.

Combine (2), (3) and (4), we have:

$$var = \frac{1}{N}\sum_{i=1}^{N}rec_{h\_i}^2 + \frac{1}{N}\sum_{i=1}^{N}rec_{l\_i}^2 - \frac{2}{N}\rho_l \cdot \|REC_h\| \cdot \|REC_l\|. \quad (5)$$

In this invention, request bits module 234 embeds values of $$M_l = \|REC_l\| = \frac{1}{N}\sum_{i=1}^{N}rec_{l\_i}^2 \text{ and } \rho_l$$

into the low bit rate Wyner-Ziv bitstream 224. $M_l$ is the module of reconstruction and $\rho_l$ is relevance parameter in terms of the low bit-rate Wyner-Ziv stream 224. Request bits module 234 also embeds the values of $$M_h = \|REC_h\| = \frac{1}{N}\sum_{i=1}^{N}rec_{h\_i}^2 \text{ and } \rho_h$$

into the high bit rate Wyner-Ziv bitstream 224. $M_h$ is the module of reconstruction and $\rho_h$ is relevance parameter in terms of the high bit-rate stream. Parameter $\rho_h$ ($\rho_l$) represents the relevance parameter between the vector of reconstructed frame (the side information) Y and the one of corresponding original frame X. These parameters are embedded in the Wyner-Ziv side bitstreams 224 and extracted by request bits estimator 234 when switching occurs. These embedded parameters are not delivered to decoder 230. Rather, during bit streaming switching operations, these data are extracted by request bits estimator 234 to calculate var at the switching point via equation (5). Request bits estimator 234 uses var to determine the number of Wyner-Ziv bits to send to decoder 230 using equation (1).

A First Exemplary Bitstream Switching Scheme

Figure 4:
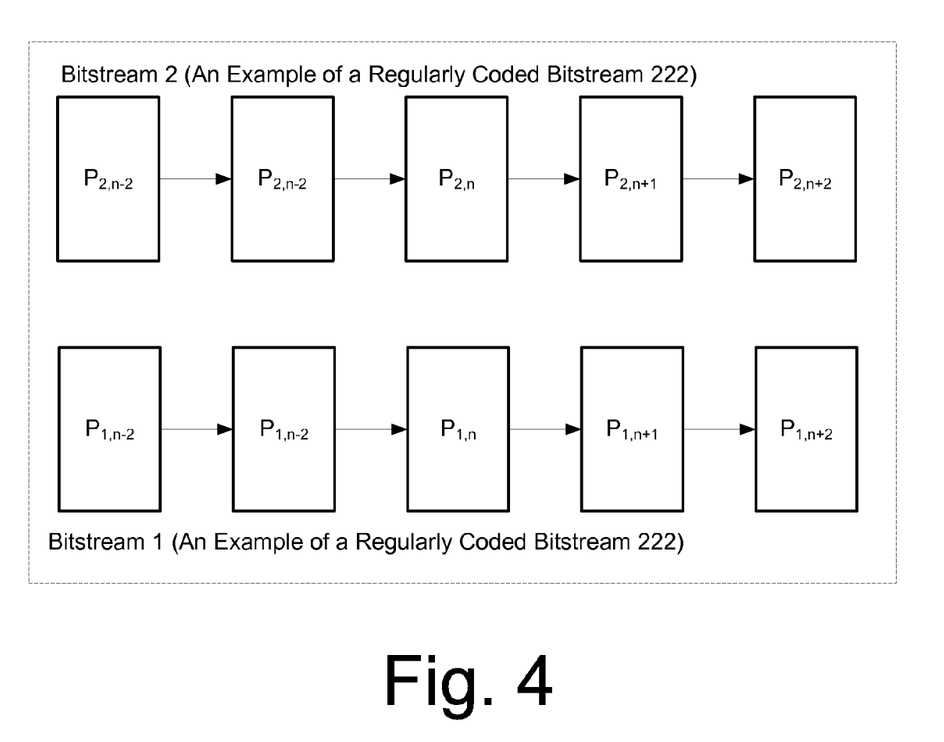
FIG. 4 shows two exemplary regularly coded bitstreams of media content, according to one embodiment.

FIG. 4 shows two exemplary coded bitstreams 222 of media content, according to one embodiment. Aspects of FIG. 4 are described with respect to components of FIG. 2. In the description, a leftmost reference numeral of a component indicates the particular figure where the component was first introduced. For example, the two bitstreams of FIG. 4 represent respective portions of coded media content 226 of FIG. 2. Referring to FIG. 4 bitstream 1 represents a lower bit rate coding of input video data and bitstream 2 represents a higher bit rate coding of the same input video data. Predictive frames $P_{1,n-2}$, $P_{1,n-1}$, ..., $P_{1,n+2}$, and $P_{2,n-2}$, $P_{2,n-1}$, ..., $P_{2,n+2}$ represent temporally consecutive frames of the two bitstreams, respectively. More particularly, $P_{k,n}$ (k=1, 2) represents the coded bits of frame n in bitstream k. The arrows indicate motion prediction directions. Additionally, for purposes of exemplary illustration, $F_{1,n-2}$, $F_{1,n-1}$, ..., $F_{1,n+2}$, and $F_{2,n-2}$, $F_{2,n-1}$, ..., $F_{2,n+2}$ denote reconstructed frames (not shown) of the two bitstreams at a decoder 230, respectively. In other words, $F_{k,n}$ (k=1, 2) indicates the reconstructed frame in bitstream k at decoder 230. In view of bitstreams 1 and 2 of FIG. 4, we now refer to FIGS. 5 and 6 to describe two respective exemplary bitstream switching schemes for multiple bit rate video streaming.

Figure 5:
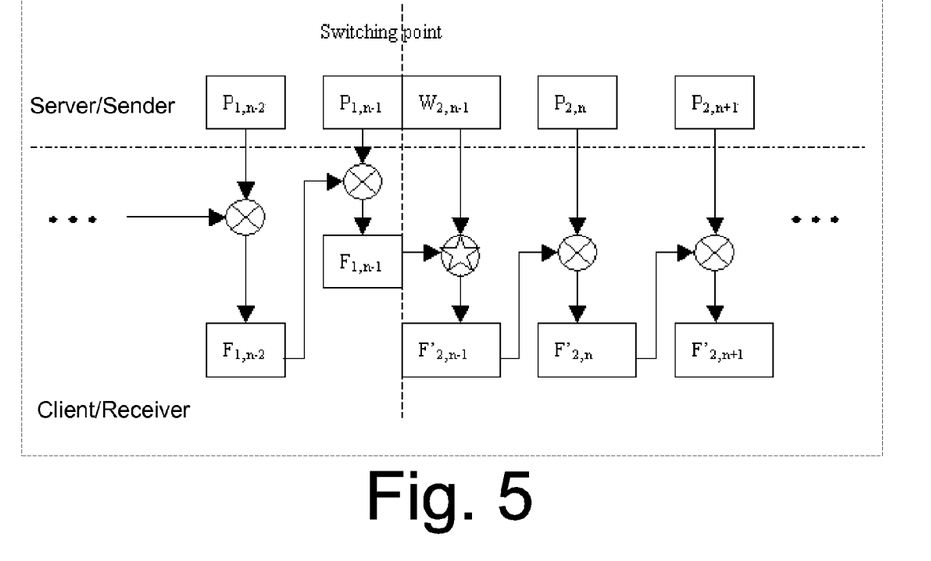
FIG. 5 shows a first exemplary Wyner-Ziv bitstream-switching scheme for multiple bit rate video streaming, according to one embodiment.

FIG. 5 shows a first exemplary Wyner-Ziv bitstream-switching scheme using request bits estimation for multiple bit rate video streaming, according to one embodiment. Referring to FIG. 5, the symbol "☆" denotes that Wyner-Ziv decoder 230 of FIG. 2 takes $F_{1,n-1}$ as side information, and the symbol "X" denotes motion-compensated prediction operations that are implemented at decoder 230 based on motion compensation correlation operations implemented at coder 216. Suppose $P_{k,n}$ (k=1, 2) represents coded bits of frame n in bitstream k. Further, suppose $F_{k,n}$ (k=1, 2) indicates the reconstructed frame in bitstream k at decoder 230 (FIG. 2). Assume that server 202 initially sends bitstream 1 (coded media content 226) up to time n and then turns to bitstream 2 (coded media content 226) due to the variance of bandwidth.

Decoder 230 reconstructs frame $F_{2,i}$ using a Wyner-Ziv methodology, with the exception that Wyner-Ziv decoder 230 does not implement a conventional request bits feedback loop with the Wyner-Ziv coder 216. The Wyner-Ziv coded parity bits (i.e., side stream) associated with of bitstream 2 are denoted as $W_{2,i}$. When the bit-streaming operations arrive at the switching point, coder 216 (or a video streaming application that leverages output of coder 216) transmits $P_{1,n-1}$. Then decoder 230 reconstructs $F_{1,n-1}$ using $F_{1,n-2}$ as the reference frame. Subsequently, $W_{2,n-1}$ are transmitted to inform decoder 230 for the purpose of switching. Decoder 230 decodes $W_{2,n-1}$ using $F_{1,n-1}$ as the side information. The decoded frame (a bitstream transition frame) $F'_{2,n-1}$ should be identical or very close to $F_{2,n-1}$ depending on the quantization step-size in the Wyner-Ziv coding. Following this, coder 216 transmits subsequent frames $P_{2,n}$, $P_{2,n+1}$ . . . to decoder 230. In summary, in this first exemplary scheme for bitstream switching, coder 216 transmits $W_{2,n-1}$ and $P_{2,n}$ in total at the switching point to decoder 230. Wyner-Ziv coding is used only at a switching point (E.g., switching occurs at time n, and therefore conventional coding and decoding is used until $P_{1,n-1}$).

Since bitstream 1 is coded at a lower rate than bitstream 2, the described switch operation represents up-switching from a lower bit rate to a higher bit rate. Wyner-Ziv bits of bitstream 1 (i.e., the parity bits generated by coder 216) are not needed for up switching.

A Second Exemplary Bitstream Switching Scheme

Figure 6:
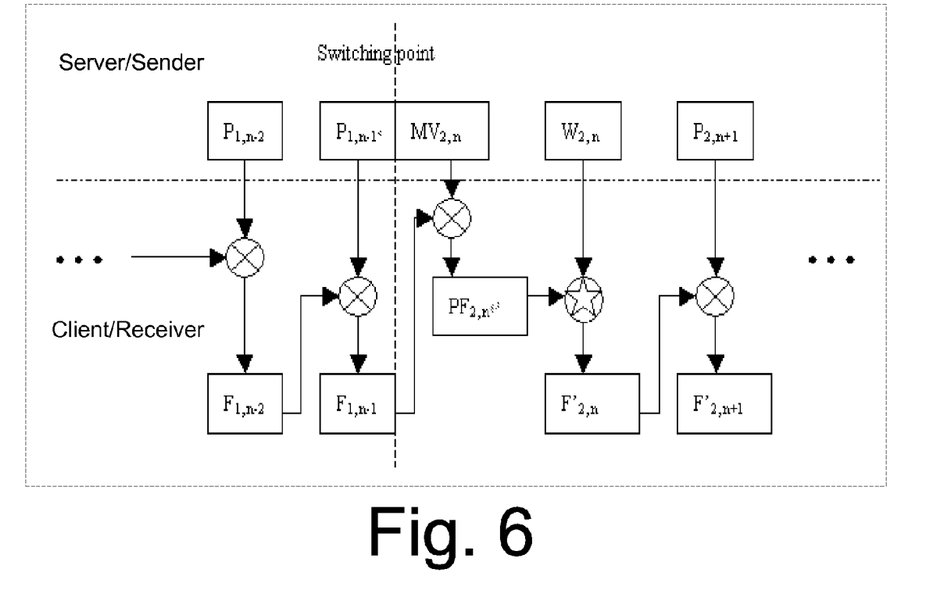
FIG. 6 shows a second exemplary Wyner-Ziv bitstream-switching scheme for multiple bit rate video streaming, according to one embodiment.

FIG. 6 shows a second exemplary Wyner-Ziv bitsteam-switching scheme for multiple bit rate video streaming, according to one embodiment. In the first exemplary bitstream switching scheme, which was described in reference to FIG. 5, coder 216 transmits entire frame $P_{2,n}$ when switching occurs at time n. In contrast to the first switching scheme, coder 216 transmits only part of $P_{2,n}$ in this second bitstream switching scheme. More particularly, the motion information (i.e. $MV_{2,n}$) and intra-coded blocks of $P_{2,n}$ are transmitted to decoder 230. Thus, the prediction of $F_{2,n}$ namely $PF_{2,n}$; is generated using the decoded motion vectors, the decoded intra blocks and the reconstructed previous frame $F_{1,n-1}$. Then, coder 216 transmits $W_{2,n}$. Decoder 230 decodes $W_{2,n}$ using $PF_{2,n}$ as side information. In this way, the decoded frame $F'_{2,n}$ can be very close to $F_{2,n}$, depending on quantization step-size in Wyner-Ziv coding. The remaining operations in the second bitstream switching scheme are similar to those described above respect to the first bitstream switching scheme. In summary, coder 216 transmits $W_{2,n-1}$ and part of $P_{2,n}$ at the switching point.

An Exemplary Procedure

Figure 7:
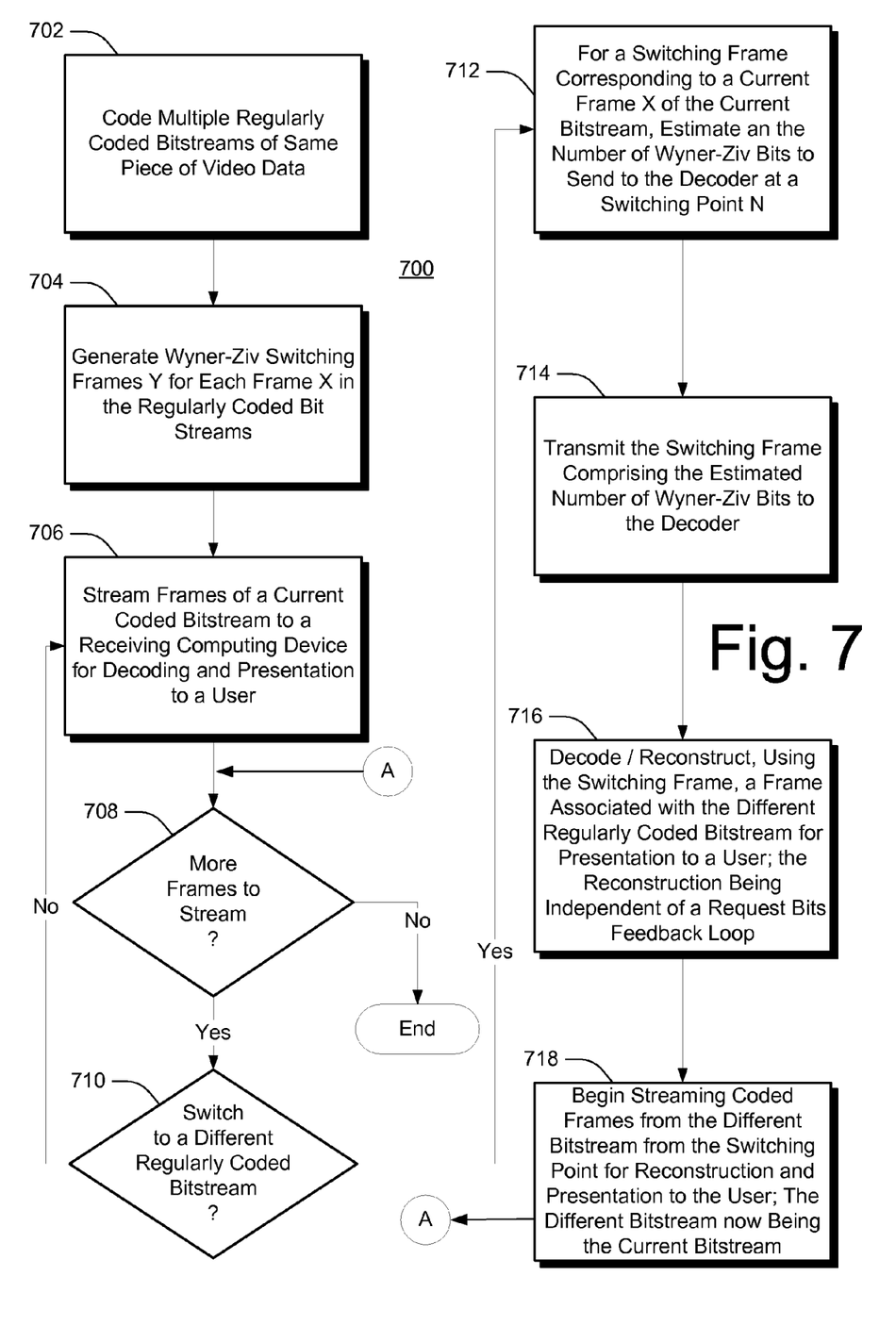
FIG. 7 shows one exemplary procedure for request bits estimation for a Wyner-Ziv codec, according to one embodiment.

FIG. 7 shows an exemplary procedure 700 request bits estimation for a Wyner-Ziv codec, according to one embodiment. For purposes of discussion, the operations of FIG. 7 are described in reference to components of FIG. 2. For instance, in the description, the left-most digit of a component reference number identifies the particular Figure in which the component first appears. In one implementation coders 216 and/or a streaming application that leverages operations of coders 216, along with decoders 230 and/or a media content playback application 240 that leverages operations of decoders 230, implements operations of procedure 700.

Referring to FIG. 7, at block 702, coder 216 individually codes (i.e., without data exchange) multiple regularly coded bitstreams 222 of a same piece of input video data. Each coded bitstream 222 is coded at a different bit rate independent of data exchange. For example, in one implementation, coder 216 individually codes multiple regularly coded bitstreams 222 based on H.264, or other non-Wyner-Ziv coding standard. At block 704, Wyner-Ziv portion of coder 216 generates Wyner-Ziv switching/correlation frames for each frame X in the regularly coded bitstreams 222. The switching frames are collectively shown as Wyner-Ziv side bitstreams 224. At block 706, coder 216, or a video streaming application that leverages output of coder 216, streams frames of a current coded bitstream 222 to a receiving computing device 206 for presentation to a user. The operations of block 708 determine whether there are more frames of the current coded bitstream 222 to stream to the remote computing device. If not, the operations of procedure 700 are complete. Otherwise, operations of procedure 700 continue at block 710.

Operations of block 710 determine whether to switch from a first regularly coded bitstream 222 to a second/different regularly coded bitstream 222. Such a determination can be made in view of multiple criteria, for example, a change in network bandwidth throughput condition, responsive to user direction, etc. If the currently streaming bitstream 222 is not to be switched, operations continue at block 706. Otherwise, operations of procedure 700 continue at block 712. Operations of block 712, for a switching frame (i.e., a respective frame from a Wyner-Ziv side bitstream 224) that corresponds to a frame X of the bitstream 222 presently being streamed, estimates a total number of Wyner-Ziv parity bits 236 to send to the decoder 230. In one implementation, this is accomplished by operations of request bits estimation module 234, as described above in the section titled "Request Bits Estimation".

Operations of block 714, at a switching point A transmit the switching frame comprising the estimated number of parity bits to the decoder 230. At block 716, and responsive to receiving the switching frame, decoder 230 decodes a frame X' of the different regularly coded bitstream 222 using the switching frame 224 and side information generated at the decoder 230. This is accomplished independent of any conventional request bits. The decoding operations associated with decoding X' represents a transition from streaming the current regularly coded bitstream 222 to streaming the different regularly coded bitstream 222. A video playback application 240 that leverages output of decoder 230 presents these decoded bits 232 to a user operations of block 718 begins streaming frames from the different bitstream 222 for presentation to the user; the different bitstream 222 now being the current bitstream 222. Operations of procedure 700 continue at block 708, as represented by on-page reference "A".

CONCLUSION

Although request bits estimation for a Wyner-Ziv codec has been described in language specific to structural features and/or methodological operations or actions, it is understood that the implementations defined in the appended claims are not necessarily limited to the specific features or actions described. For example, FIG. 1 shows that Wyner-Ziv portion of coder 216 encapsulates logic of request bits estimator 234. However, in a different implementation, coder 216 logic of request bits estimator 234 is not encapsulated inside of coder 216. Instead, a separate computer-program module encapsulates request bits estimator 234. In such an implementation, request bits estimator 234 implements and exposes an application programming interface for Wyner-Ziv encoder 216 to determine an estimated number of bits 236 to send to decoder 230. Thus, the specific features and operations discussed above with respect to FIGS. 2-7 are disclosed as exemplary forms of implementing the claimed subject matter.

The invention claimed is:

1. A method at least partially implemented by a computer, the method comprising:
   prior to communicating Wyner-Ziv parity bits to a Wyner-Ziv decoder, determining, by a Wyner-Ziv coder, an estimated number of bits to embed in the Wyner-Ziv parity bits for the Wyner-Ziv decoder to reconstruct a frame of different coded content from the Wyner-Ziv parity bits such that the frame will meet a particular quality criteria; and
   communicating the Wyner-Ziv parity bits comprising the estimated number of bits to the Wyner-Ziv decoder for reconstruction and presentation of the frame to a user, the reconstruction being independent of a request bits feedback loop between the Wyner-Ziv coder and the Wyner-Ziv decoder.

2. A method at least partially implemented by a computer, the method comprising:
   prior to communicating Wyner-Ziv parity bits to a Wyner-Ziv decoder, determining, by a Wyner-Ziv coder, an estimated number of bits to embed in the Wyner-Ziv parity bits for the Wyner-Ziv decoder to reconstruct a frame of different coded content from the Wyner-Ziv parity bits such that the frame will meet a particular quality criteria; and
   communicating the Wyner-Ziv parity bits comprising the estimated number of bits to the Wyner-Ziv decoder for reconstruction and presentation of the frame to a user, the reconstruction being independent of a request bits feedback loop between the Wyner-Ziv coder and the Wyner-Ziv decoder, wherein operations associated with determining the estimated number of bits and communicating the Wyner-Ziv parity bits to the Wyner-Ziv decoder are implemented by a Wyner-Ziv codec to switch from a first bitstream to a second bitstream, the first bitstream and the second bitstream having been coded using a coding algorithm that is not a Wyner-Ziv coding algorithm, the Wyner-Ziv parity bits representing a correlation frame between the first bitstream coded at a first bit rate and the second bitstream coded at a second bit rate that is different than the first bit rate.

3. A method at least partially implemented by a computer, the method comprising:
   prior to communicating Wyner-Ziv parity bits to a Wyner-Ziv decoder, determining, by a Wyner-Ziv coder, an estimated number of bits to embed in the Wyner-Ziv parity bits for the Wyner-Ziv decoder to reconstruct a frame of different coded content from the Wyner-Ziv parity bits such that the frame will meet a particular quality criteria; wherein prior to determining the estimated number of bits and prior to communicating the Wyner-Ziv parity bits, embedding, during Wyner-Ziv coding operations, information into the Wyner-Ziv parity bits to facilitate determining the estimated number of bits, embedding the information comprising:
      analyzing, to generate the information, statistical dependencies between distributions of signals in a reconstructed original frame as compared to distributions of signals in reconstructed side information frame; and
      embedding the information into the Wyner-Ziv parity bits; and
   wherein determining the estimated number of bits further comprises:
      deriving the information from the Wyner-Ziv parity bits; and
      calculating the estimated number of bits using the information; and
   communicating the Wyner-Ziv parity bits comprising the estimated number of bits to the Wyner-Ziv decoder for reconstruction and presentation of the frame to a user, the reconstruction being independent of a request bits feedback loop between the Wyner-Ziv coder and the Wyner-Ziv decoder.

4. The method of claim 3, wherein information comprises frame reconstruction vectors and parameters indicating relevancy between respective ones of the vectors associated with the reconstructed side information frame and the reconstructed original frame.

5. The method of claim 4, wherein the relevancy between respective ones of the vectors is based on a bit rate of a Wyner-Ziv stream that encapsulates the Wyner-Ziv parity bits.

6. The method of claim 3, wherein the information comprises frame reconstruction vectors and parameters indicating relevancy between respective ones of the vectors associated with a reconstructed frame and original video data, and wherein calculating the estimated number of bits further comprises:
   determining a Laplacian model parameter in terms of the Wyner-Ziv parity bits; and
   estimating, using the Laplacian model parameter in view of a correlation model, the estimated number of bits.

7. The method of claim 6, wherein the Laplacian model parameter is estimated or derived in terms of a Wyner-Ziv frame.

8. The method of claim 6, wherein the correlation model is pre-created by determining a relationship between actual numbers of request bits to obtain a predetermined reconstructed frame target quality for a set of test image frames, an estimated number of bits based on a theory bound number of request bits, and the Laplacian model parameter.

9. A computer-readable medium comprising computer-program instructions executable by a processor, the computer-program instructions when executed by the processor for performing operations comprising:
   coding, using a first coding algorithm that is not a Wyner-Ziv based coding algorithm, a first bitstream and a second bitstream from the same piece of video content, the first bitstream been coded at a different bit rate than the second bitstream;
   coding, using a Wyner-Ziv based coding algorithm, a third bitstream from the same piece of video content, the third bitstream comprising multiple frames of Wyner-Ziv parity bits, each frame of the frames corresponding to a respective one frame of the second bitstream each frame being a correlation frame for communicating to a Wyner-Ziv decoder when switching from the first bitstream to the second bitstream, the coding comprising:
      for each frame of the frames, embedding information into the frame, the information being based on statistical dependencies between distributions of signals and reconstructed ones of the frame and a corresponding one frame of the second bitstream;
      at a switching point between the first bitstream and the second bitstream, and prior to sending a correlation frame of the frames that corresponds to the switching point, estimating an additional number of bits to add to the correlation frame based on the information embedded in the correlation frame;

adding the additional number of bits to the correlation frame; and streaming the correlation frame to the Wyner-Ziv decoder to switch from streaming the first bitstream to streaming the second bitstream.

10. The computer-readable medium of claim 9, wherein the computer-program instructions further comprise instructions for extracting the information embedded in the correlation frame before streaming the correlation frame to the Wyner-Ziv decoder.

11. The computer-readable medium of claim 9, wherein the computer-program instructions further comprise instructions for:

generating multiple Wyner-Ziv streams, each Wyner-Ziv stream comprising respective switching frames to switch between non-Wyner-Ziv coded bitstreams coded at different bit rates;

for each switching frame, generating information to facilitate determining, by the Wyner-Ziv coder, an additional number of bits to insert into the switching frame prior to sending the switching frame to the Wyner-Ziv decoder to switch between non-Wyner-Ziv coded bitstreams coded at respective different bit rates; and embedding the information into each switching frame.

12. The computer-readable medium of claim 9, wherein the computer-program instructions for embedding the information into the frame further comprise instructions for:

reconstructing the frame to generate a reconstructed frame; and analyzing, to generate the information, statistical dependencies between distributions of signals in the reconstructed frame as compared to distributions of signals in an original frame of video content that corresponds to the reconstructed frame.

13. The computer-readable medium of claim 12, wherein information comprises frame reconstruction vectors and parameters indicating relevancy between respective ones of the vectors associated with the reconstructed frame the original frame.

14. The computer-readable medium of claim 13, wherein the relevancy between respective ones of the vectors is based on a bit rate of a Wyner-Ziv stream that encapsulates the frame.

15. The computer-readable medium of claim 12, wherein the information comprises frame reconstruction vectors and parameters indicating relevancy between respective ones of the vectors associated with the reconstructed frame the original frame, and wherein estimating the additional number of bits further comprises:

determining a Laplacian model parameter in terms of the frame; and estimating, using the Laplacian model parameter in view of a correlation model, the estimated number of bits.

16. The computer-readable medium of claim 15, wherein the Laplacian model parameter is estimated or derived in terms of a Wyner-Ziv frame.

17. The computer-readable medium of claim 15, wherein the correlation model is pre-created by determining a relationship between actual numbers of request bits to obtain a predetermined reconstructed frame target quality for a set of test image frames, an estimated number of bits based on a theory bound number of request bits, and the Laplacian model parameter.

18. A computer comprising:

a processor; and a memory coupled to the processor, the memory comprising computer-program instructions executable by the processor for:

responsive to a determination to switch from a first bitstream to a second bitstream at a switching point, selecting a correlation frame from a third bitstream that corresponds to the switching point, the correlation frame comprising Wyner-Ziv parity bits;

extracting information from the correlation frame to estimate a number of additional bits to add to the correlation frame, the additional bits allowing a decoder to reconstruct a non-Wyner-Ziv coded frame to a target level of quality independent of a request-bits feedback loop between an encoder and the decoder; and streaming the correlation frame to the decoder to initiate streaming of frames associated with the second bitstream to the decoder for reconstructions and presentation to a user.

19. The computer of claim 18, wherein the computer-program instructions further comprise instructions for generating the information as follows:

analyzing statistical dependencies between distributions of signals in a reconstructed non-Wyner-Ziv side information frame as compared to distributions of signals in an original non-coded frame of video content from which the correlation frame was generated;

responsive to analyzing the statistical dependencies, identifying reconstruction vectors and parameters indicating relevancy between respective ones of the vectors associated with the reconstructed non-Wyner-Ziv side information frame and the original non-coded frame; and embedding the reconstruction vectors and the parameters into the correlation frame during correlation frame coding operations, the reconstruction vectors in the parameters being the information.

20. The computer of claim 19, wherein relevancy between respective ones of the vectors is based on a bit rate of a Wyner-Ziv stream that encapsulates the correlation frame.

* * * * *